United States Patent [19]

Adlhoch

[11] 4,449,203

[45] May 15, 1984

[54] MEMORY WITH REFERENCE VOLTAGE GENERATOR

[75] Inventor: Richard H. Adlhoch, Tempe, Ariz.

[73] Assignee: Motorola, Inc., Schaumburg, Ill.

[21] Appl. No.: 238,178

[22] Filed: Feb. 25, 1981

[51] Int. Cl.³ .............................................. G11C 11/40
[52] U.S. Cl. ..................................... 365/104; 365/210
[58] Field of Search ................... 365/94, 95, 103, 104, 365/149, 174, 189, 210, 182

[56] References Cited

U.S. PATENT DOCUMENTS

| | | | |
|---|---|---|---|
| 4,094,008 | 6/1978 | Lockwood et al. | 365/149 |
| 4,202,044 | 5/1980 | Beilstein, Jr. et al. | 365/182 |
| 4,342,102 | 7/1982 | Puar | 365/207 |

Primary Examiner—Joseph A. Popek
Attorney, Agent, or Firm—Joe E. Barbee

[57] ABSTRACT

A reference voltage generator useful in a memory having memory locations capable of storing more than two states provides references which are used to determine which state is stored in a selected memory cell. The output of the reference voltage generator is connected to comparator circuitry which also receives the output from the selected memory cell. The reference voltage generator generates each one of the required voltages every time a row is selected in the memory. The comparator circuitry serves as a sense amplifier and provides a memory output.

9 Claims, 3 Drawing Figures

MEMORY WITH REFERENCE VOLTAGE GENERATOR

CROSS REFERENCE TO RELATED APPLICATIONS

Patent application Ser. Nos. 238,183 and 238,177 are related co-pending applications by the same inventor, assigned to the same assignee, and filed on the same date as the present application.

BACKGROUND OF THE INVENTION

This invention relates, in general, to memory arrays, and more particularly, to a memory array having a reference voltage generator for use with multi-state memory cells of the memory array.

Memory arrays of the past typically contain memory cells which are capable of storing one or the other of two states. These type of memory arrays did not require an elaborate reference voltage generator since only one of two states was expected to be found in a given memory storage location. A memory having storage locations capable of storing more than two states requires some way of determining which of the multiple states is stored in a given storage location. A voltage reference would be useful in a memory array having memory cells which store more than two states in the form of a voltage level.

Accordingly, it is an object of the present invention to provide a memory array having a reference voltage generator all on the same chip with a plurality of memory cells capable of storing more than two states.

Another object of the present invention is to provide a reference voltage generator for a read only memory which is useful for determining a voltage level stored within a memory cell of the memory.

Yet another object of the present invention is to provide a memory having a reference voltage generator and a comparator for comparing the difference between the reference voltage generator and a voltage level from a memory cell capable of storing more than two states.

Yet a further object of the present invention is to provide a reference signal which is generated in the same manner as a signal to be identified whereby wide processing variations can be tolerated since the reference signal will track the unknown signal very closely.

SUMMARY OF THE INVENTION

In carrying out the above and other objects of the invention in one form, there is provided a memory array having a reference voltage generator, and the memory further having a plurality of storage locations capable of storing more than two states. The reference voltage generator is formed on the same integrated circuit as the memory array and provides a reference means for the memory. The reference is coupled to a comparator which also receives the information from a selected storage location and compares such information to the reference and generates an output which is used to generate binary bits corresponding to the state of the selected storage location.

The exemplification set out herein illustrates the preferred embodiment of the invention in one form thereof, and such exemplification is not to be construed as limiting in any manner.

DETAILED DESCRIPTION OF THE DRAWINGS

Figure 1:
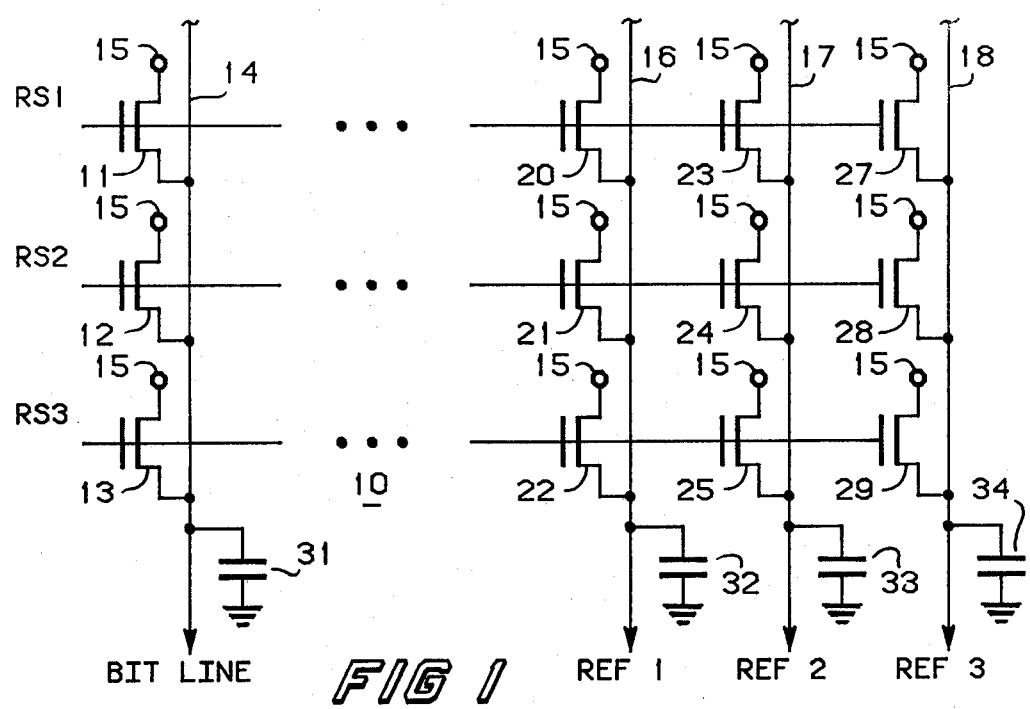
FIG. 1 shows in schematic form a small portion of a memory embodying the present invention.

FIG. 1 illustrates in schematic form a portion of a memory array 10 which has been illustrated as being a read only memory. Memory 10 has a plurality of storage locations containing transistor storage elements. Three of such transistor storage elements are illustrated as transistors 11, 12 and 13. All three storage transistors have their source electrodes connected to column or bit line 14 and have their drain electrodes connected to a voltage terminal 15. Transistors 11, 12 and 13 are connected in a source follower configuration and may have threshold voltages which are different from each other. These storage transistors have been more fully described in co-pending patent application Ser. No. 238,183, mentioned hereinbefore as a related application, and is hereby incorporated herein by reference.

Memory 10 also has three additional column lines 16, 17 and 18. Column line 16 serves as a first reference line, column line 17 serves as a second reference line, and column 18 serves as a third reference line. Transistors 20 through 25 and transistors 27 through 29 are all connected in a source follower configuration as are transistors 11, 12 and 13. Transistor 20 has its drain electrode connected to voltage power supply terminal 15 and its source electrode connected to reference column line 16. The gate electrode of transistor 20 is connected in common to the gate electrode of transistors 23 and 27 and to row select line 1 (RS1). When row select line 1 is activated transistors 11, 20, 23 and 27 are enabled. Transistors 21 and 22 have their drain electrodes connected to voltage terminal 15 and their source electrodes connected to column line 16. The gate electrode of transistor 21 is connected to row select line 2 (RS2) and the gate electrode of transistor 22 is connected to row select line 3 (RS3). Transistors 23, 24 and 25 have their drain electrodes connected to voltage terminal 15 and their source electrodes connected to column line 17. Transistor 24 has its gate electrode connected to row select line 2 and transistor 25 has its gate electrode connected to row select line 3. Transistors 27, 28 and 29 have their drain electrodes connected to voltage terminal 15 and their source electrodes connected to column line 18. Transistor 28 has its gate electrode connected to row select line 2 and transistor 29 has its gate electrode connected to row select line 3. Column line 16 has a parasitic capacitance associated with it which is illustrated by capacitor 32. Column select lines 17 and 18 also have parasitic capacitances associated with them which are illustrated by capacitors 33 and 34, respectively. The parasitic capacitance associated with bit line 14 is illustrated by capacitor 31. The parasitic capacitances of column lines 14, 16, 17 and 18 will all be substantially equal if all of the transistors connected to the column lines are of equal physical size. Accordingly, the reference transistors 20 through 25 and 27 through 29 are all made the same physical size as transistors 11, 12, and 13 which also are of equal size.

In a preferred embodiment of memory 10 each storage location is capable of providing one of four possible voltages. The sensing circuitry of the memory must be able to distinguish which one of these four voltages is present. This can be accomplished by using three comparators wherein each comparator has a different reference. This allows the comparators to detect which of the four possible voltages is present. A fourth comparator is not required since one of the voltage levels, either the highest or the lowest, can be detected by the presence of all "ones" or all "zeros" (whichever is appropriate) at the three comparator outputs. The three different references required by the comparators are provided by column lines 16, 17 and 18. Transistors 20, 21 and 22 are each capable of providing an identical voltage which appears on column line 16. Transistor 20, 21 or 22 is only enabled when its corresponding row select line is activated. Of course, when transistor 21 is enabled so are transistors 24 and 28, and when transistor 22 is enabled so are transistors 25 and 29 since all of their gate electrodes are connected to the same row select line. Transistors 23, 24 and 25 all provide one of the four possible voltages while transistors 27, 28 and 29 all provide yet another one of the four possible voltages. Therefore column line 16 will carry one of the four possible voltages, column line 17 will carry another one of the four possible voltages and column line 18 will carry yet a third one of the four possible voltages. As will be explained in greater detail hereinafter, column lines 16, 17 and 18 are each directly connected to a respective comparator. Bit line 14 is selectively coupled to a line which goes to the inputs of all three of the comparators. Memory array 10 can have many bit lines and each one of the bit lines can be selected through a column decoder to be coupled to the three comparators.

Figure 2:
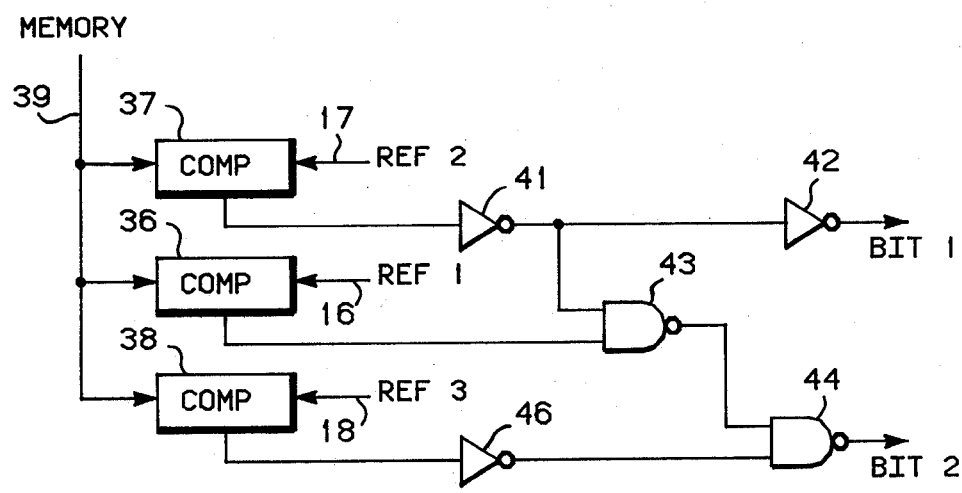
FIG. 2 illustrates in a logic and block diagram form a portion of the output circuitry for the memory of FIG. 1.

FIG. 2 illustrates three comparators 36, 37 and 38. Each comparator has two inputs with one of the inputs of each comparator being connected to line 39 which is in turn selectively coupled to a selected bit line from the memory array. Comparator 36 has a second input which is connected to column line 16 to receive a first reference voltage. Comparator 37 has a second input which is connected to column line 17 to receive a second reference level and comparator 38 has a second input which is connected to column line 18 to receive a third reference level. Comparators 36, 37 and 38 serve as a sense amplifier for the memory array. The output of comparator 37 is connected to an inverter 41 whose output goes to an input of a NAND gate 43 and to the input of inverter 42. The output of inverter 42 provides a Bit 1 output for the memory. Since it was assumed that each memory location was capable of storing one of four states each memory location can represent two binary bits. The output of comparator 36 is connected to a second input of NAND gate 43. The output of NAND gate 43 is connected to an input of NAND gate 44. The output of NAND gate 44 provides Bit 2. The output of comparator 38 is connected to an inverter 46 whose output is connected to a second input of NAND gate 44. Inverters 41, 42 and 46 along with NAND gates 43 and 44 serve as a logic translator or decoder for the outputs of comparators 36, 37 and 38 to provide the two bit output from each memory storage location.

The truth table for the circuitry of FIG. 2 appears as follows:

| Memory Cell Output (Unknown) | Comparator Output | | | Bit 1 | Bit 2 |
|---|---|---|---|---|---|
| | C1 | C2 | C3 | | |
| 1 (highest) | 0 | 0 | 0 | 0 | 0 |
| 2 | 1 | 0 | 0 | 0 | 1 |
| 3 | 1 | 1 | 0 | 1 | 0 |
| 4 (lowest) | 1 | 1 | 1 | 1 | 1 |

The left hand column of the truth table indicates the four possible states that can be stored in the memory cells. Since the transistor in each memory cell is connected in a source follower configuration the output from the memory cells will be a voltage. Number 1 is assumed to be the highest voltage with number 4 the lowest voltage. Comparator output C1 is the output for comparator 36, comparator output C2 is the output for comparator 37, and comparator output C3 is the output for comparator 38. Through an arbitrary choice, when the highest output voltage from a memory cell is present, all the comparator outputs are zeros which represent output bits 1 and 2 as zeros. When the second highest voltage level is present in the selected memory cell then the output from comparator 36 is a logic level "1" while the output from comparators 37 and 38 are logic levels "0" which produce output Bit 1 as a logic level "0" and output Bit 2 as a logic level "1." When the third highest voltage level is present in a selected memory cell then the output of comparators 36 and 37 are logic level "1's" and the output of comparator 38 is a logic level "0" making output Bit 1 a logic level "1" and output Bit 2 a logic level "0." The lowest voltage level in a memory cell causes all the outputs from the comparators to be logic level "1's" making output Bit 1 a logic level "1" and output Bit 2 a logic level "1." From this it can be seen that the first reference voltage level provided by column line 16 can be equal to the second highest voltage level or could be some value between the first and second highest voltage levels. The second reference voltage level provided by column line 17 could be equal to the third highest voltage level or some voltage level between voltage levels 2 and 3. The third reference voltage level provided by column line 18 could be equal to the lowest voltage level or some value between the third and fourth voltage levels.

Figure 3:
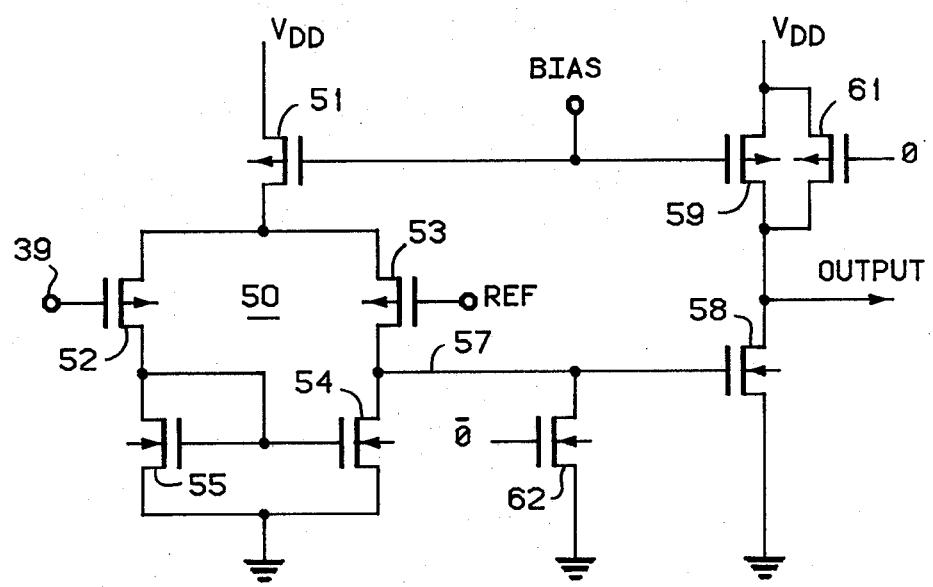
FIG. 3 illustrates in schematic form a comparator useful in the circuitry of FIG. 2.

FIG. 3 represents in schematic form a possible comparator which could serve as comparators 36, 37 or 38. The actual comparator 50 includes transistors 51 through 55. The rest of the circuitry illustrated in FIG. 3 helps to condition the output so that it will be useful to fulfill the requirements of the truth table shown above. Transistor 51 is a P-channel transistor having its source connected to voltage terminal VDD and its drain electrode connected to the source terminals of P-channel transistors 52 and 53. Transistor 52 has its gate electrode connected to line 39 which carries the output from the selected memory cell. Transistor 53 has its gate electrode connected to either column line 16, 17 or 18 to receive the reference voltage level. The drain electrode of transistor 52 is connected to the drain electrode and gate electrode of an N-channel transistor 55. The source electrode of transistor 55 is connected to a voltage terminal illustrated as ground. The drain electrode of transistor 53 is connected to the drain electrode of an N-channel transistor 54. The gate electrode of transistor 54 is connected to the gate electrode of transistor 55 and the source electrode of transistor 54 is connected to ground. An output for comparator 50 appears on line 57 which is connected to the drain electrode of an N-channel transistor 62 and the gate electrode of an N-channel transistor 58. Both transistor 62 and 58 have their source electrodes connected to ground. The gate electrode of transistor 62 is connected to a strobe signal illustrated as $\bar{\phi}$. The drain electrode of transistor 58 is connected to an output which represents the output of comparator 36, 37 or 38. The output is also connected to the drain electrode of a P-channel transistor 59 which has its source electrode connected to voltage terminal VDD. A P-channel transistor 61 appears in parallel with transistor 59. The gate electrode of transistor 61 is connected to a strobe signal illustrated as $\phi$. The gate electrode of transistor 59 is connected to the gate electrode of transistor 51 and to a bias source. The bias source is provided to enable transistors 51 and 59. The purpose of transistor 61 is to provide a logic level "1" at the output when information is not being read from the memory. This insures that the output always starts from the same level before data is read from the memory. During the read cycle of the memory, the $\phi$ strobe signal would be at a high level thereby disabling transistor 61 and $\bar{\phi}$ would be at low level thereby disabling transistor 62. When the memory is not being read from, the $\phi$ strobe signal will go to a low level thereby enabling transistor 61 and $\bar{\phi}$ will go high thereby enabling transistor 62 which places the gate electrode of transistor 58 near ground level thereby preventing transistor 58 from becoming conductive. When the voltage level on line 39 which is connected to the gate electrode of transistor 52 is higher than the reference level appearing at the gate electrode of transistor 53 then the output is a logic level "0," and when the input voltage on line 39 is equal to or less than the reference voltage appearing at the gate electrode of transistor 53 then the output is a logic level "1." Transistors 52 and 53 are ratioed so that the output will be a logic level "1" when the voltage on line 39 is equal to the reference voltage. This means that transistor 52 is physically larger than transistor 53.

By now it should be appreciated that there has been provided output circuitry which serves as a sense amplifier and a reference voltage generator useful with a memory which has storage locations capable of storing more than two states. The reference voltage means allows a set of comparators to sense which one of four different voltage levels has been generated by a selected memory cell. Since it is assumed that each memory cell is only capable of storing one of four different states it has been determined that only three reference voltages need be generated. Each of the three reference voltages is generated by a transistor having a threshold voltage close to or the same as the threshold voltage of a transistor used in the memory array and connected in the same manner. Thus each of the three reference voltages will correspond very closely to one of the four possible voltages out of the memory. By comparing the voltage out of the memory to these three reference voltages it is determined which voltage level has been generated. This generated voltage is then translated to logic levels representing the two binary outputs. The reference voltages are generated in a manner so that each time a row is selected the three required voltage levels are generated. The reference voltage devices are arranged in columns which are identical to the layout of the memory columns. Consequently, any circuit parameter which can affect performance (such as line capacitance, device size, etc.), and which might vary in processing, will vary the reference devices exactly the same as the memory devices. Therefore the reference voltages will track the memory signals, and the memory array will work over a wide range of processing parameters.

I claim:

1. A read only memory having a plurality of memory cells arranged in columns and rows, the memory also comprising: the memory cells being capable of providing an output having more than two states; a plurality of comparators selectively coupled to the columns; a plurality of reference sources arranged in groups wherein each group is coupled to a different comparator, each of the reference sources is a transistor connected in a source follower configuration and each of the transistors is a field effect transistor and at least two of the transistors have threshold voltages different from each other; and logic means coupled to the comparators to receive an output provided by each comparator, the logic means providing digital bits representative of the state of a selected memory cell.

2. The memory of claim 1 wherein at least a predetermined one of the reference sources is enabled when one of the rows in the memory is selected.

3. The memory of claim 1 wherein the memory cells are capable of storing at least four states.

4. The memory of claim 3 wherein the memory cells each have a transistor connected in a source follower configuration.

5. The memory of claim 4 wherein said each group of reference sources is arranged as a column in the memory.

6. A memory array having a plurality of storage cells wherein each storage cell is capable of storing m states where m is greater than two and where the m states appear as voltage levels, the memory array having n reference sources where $n+1=m$, the reference sources being arranged in columns and rows, and having a number of columns equivalent to n wherein each column has a plurality of reference sources equal to one of the states, the number of rows being equal to the number of rows found in the memory array wherein each row of reference sources provides n references, and at least n comparators, each comparator being coupled to a different column of reference sources and the comparators being controllably coupled to a selected memory column.

7. The memory array of claim 6 wherein the reference sources are enabled by a row select command which also selects a row in the memory array, each of the reference sources being a transistor connected in a source follower configuration and having a predetermined threshold voltage to render a desired reference voltage.

8. A memory having a plurality of memory cells arranged in rows and columns, comprising: a transistor connected in a source follower configuration being in each memory cell and having a threshold voltage so that at least one transistor has a threshold voltage different from another of the transistors so that more than two states can be represented by a memory cell; reference means arranged adjacent the memory cells for providing reference voltage to be compared with the states of the memory cells, the reference means being arranged in rows and columns so that each column provides a predetermined reference voltage which differs from an adjacent column's reference voltage; and comparator means selectively coupled to a memory cell and coupled to the reference means to provide an output indicative of the states stored in the memory cell which was selectively coupled to the comparator.

9. A reference voltage generator for a digital memory having a plurality of memory cells arranged in rows and columns, the memory cells being capable of storing more than two states, comprising: a plurality of reference transistors connected in a source follower configuration for each reference voltage required and arranged in rows and columns wherein each said transistor in a selected row is enabled by a row select signal so that said transistors are only enabled when the memory cells in the selected row are being accessed; and means for comparing contents of the memory cells with said transistor so that the state of the contents of the memory cells can be determined.

* * * * *

UNITED STATES PATENT AND TRADEMARK OFFICE
CERTIFICATE OF CORRECTION

PATENT NO. : 4,449,203
DATED : May 15, 1984
INVENTOR(S) : Richard H. Adlhoch

It is certified that error appears in the above-identified patent and that said Letters Patent is hereby corrected as shown below:

Column 6, claim 8, line 63, change "voltage" to --voltages--.

Signed and Sealed this

Eleventh Day of December 1984

[SEAL]

Attest:

GERALD J. MOSSINGHOFF

Attesting Officer  Commissioner of Patents and Trademarks